United States Patent
Fujiwara et al.

(10) Patent No.: US 10,995,422 B2
(45) Date of Patent: May 4, 2021

(54) GAAS SUBSTRATE AND METHOD FOR MANUFACTURING THE SAME

(71) Applicant: Sumitomo Electric Industries, Ltd., Osaka (JP)

(72) Inventors: Shinya Fujiwara, Osaka (JP); Yasuaki Higuchi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/334,072

(22) PCT Filed: May 26, 2017

(86) PCT No.: PCT/JP2017/019725
§ 371 (c)(1),
(2) Date: Mar. 18, 2019

(87) PCT Pub. No.: WO2018/216203
PCT Pub. Date: Nov. 29, 2018

(65) Prior Publication Data
US 2019/0257002 A1 Aug. 22, 2019

(51) Int. Cl.
*C30B 11/00* (2006.01)
*C30B 29/42* (2006.01)
(Continued)

(52) U.S. Cl.
CPC .............. *C30B 29/42* (2013.01); *C30B 11/00* (2013.01); *C30B 29/38* (2013.01); *C30B 33/00* (2013.01);
(Continued)

(58) Field of Classification Search
CPC ..... H01L 21/306; H01L 21/304; C30B 29/42; C30B 29/38; C30B 33/00; C30B 33/10; C30B 11/00
See application file for complete search history.

(56) References Cited

U.S. PATENT DOCUMENTS 5,250,471 A * 10/1993 Kogure ............. H01L 21/30617
257/E21.22
9,368,585 B2 * 6/2016 Eichler ................. C30B 11/002
(Continued)

FOREIGN PATENT DOCUMENTS

JP          H04-192584 A      7/1992
JP          2000-354834 A    12/2000
(Continued)

OTHER PUBLICATIONS

"Ultrasonics—The What and Why of Sweeping Frequency", Fuchs John, Cleaning Technologies Group, Mar. 24, 2014, https://techblog.ctgclean.com/2014/03/ultrasonics-the-what-and-why-of-sweeping-frequency/ (Year: 2014).*
(Continued)

*Primary Examiner* — Daniel J. Schleis
*Assistant Examiner* — Kevin C T Li
(74) *Attorney, Agent, or Firm* — Faegre Drinker Riddle & Reath LLP

(57) ABSTRACT

A GaAs substrate has a first surface. The sum of the number of particles having a longer diameter of more than or equal to 0.16 μm which are present in the first surface, per $cm^2$ of the first surface, and the number of damages having a longer diameter of more than or equal to 0.16 μm which are present in a second surface, per $cm^2$ of the second surface, is less than or equal to 2.1, the second surface being formed by etching the first surface by 0.5 μm in a depth direction.

5 Claims, 2 Drawing Sheets

(51) Int. Cl.
*C30B 33/10* (2006.01)
*H01L 21/304* (2006.01)
*H01L 21/306* (2006.01)
*C30B 29/38* (2006.01)
*C30B 33/00* (2006.01)

(52) U.S. Cl.
CPC ............ *C30B 33/10* (2013.01); *H01L 21/304* (2013.01); *H01L 21/306* (2013.01)

(56) References Cited

U.S. PATENT DOCUMENTS

2008/0276959 A1* 11/2008 Burger .................... B08B 3/123
 134/1.3
2008/0296738 A1* 12/2008 Nishiura ................. C30B 29/42
 257/631

FOREIGN PATENT DOCUMENTS

| JP | 2008-513200 A | 5/2008 |
| JP | 2008-300747 A | 12/2008 |
| JP | 2010-87444 A | 4/2010 |
| WO | WO-2006/031991 A2 | 3/2006 |

OTHER PUBLICATIONS

"Epitaxial Growth and Selectivity of AlxGa1-xAs Using Novel Metalorganic Procedures", Goorsky et al., J. Electrochem. Soc., vol. 138, No. 6, Jun. 1991, pp. 1817-1826 (Year: 1991).*

* cited by examiner

GAAS SUBSTRATE AND METHOD FOR MANUFACTURING THE SAME

TECHNICAL FIELD

The present invention relates to a GaAs substrate and a method for manufacturing the same.

BACKGROUND ART

Japanese Patent Laying-Open No. 2008-300747 (PTL 1) discloses a GaAs substrate which allows removal of foreign matter and oxides adhering to its surface by common thermal cleaning, by polishing a surface of a wafer, cleaning the surface with an alkaline cleaning solution, and cleaning the surface with an acid cleaning solution. Recently, it has been considered, for example, to improve detergency (removal capability) of an alkaline cleaning solution by cleaning a surface of a wafer with ultrasound being applied to the alkaline cleaning solution.

CITATION LIST

Patent Literature

PTL 1: Japanese Patent Laying-Open No. 2008-300747

SUMMARY OF INVENTION

A GaAs substrate in accordance with one aspect of the present disclosure is a GaAs substrate having a first surface, wherein a sum of a number of particles having a longer diameter of more than or equal to 0.16 µm which are present in the first surface, per $cm^2$ of the first surface, and a number of damages having a longer diameter of more than or equal to 0.16 µm which are present in a second surface, per $cm^2$ of the second surface, is less than or equal to 2.1, the second surface being formed by etching the first surface by 0.5 µm in a depth direction.

A method for manufacturing a GaAs substrate in accordance with one aspect of the present disclosure is a method for manufacturing a GaAs substrate having a cleaning step for obtaining the GaAs substrate from a GaAs substrate precursor, the cleaning step including a first step of cleaning the GaAs substrate precursor by applying ultrasound to the GaAs substrate precursor in an alkaline solution, and a second step of cleaning the GaAs substrate precursor by applying the ultrasound to the GaAs substrate precursor in an acid solution, the first step including an operation of continuously changing a frequency of the ultrasound at least from 900 kHz to 2 MHz, the second step including an operation of continuously changing the frequency of the ultrasound at least from 900 kHz to 2 MHz.

DETAILED DESCRIPTION

Figure 1:
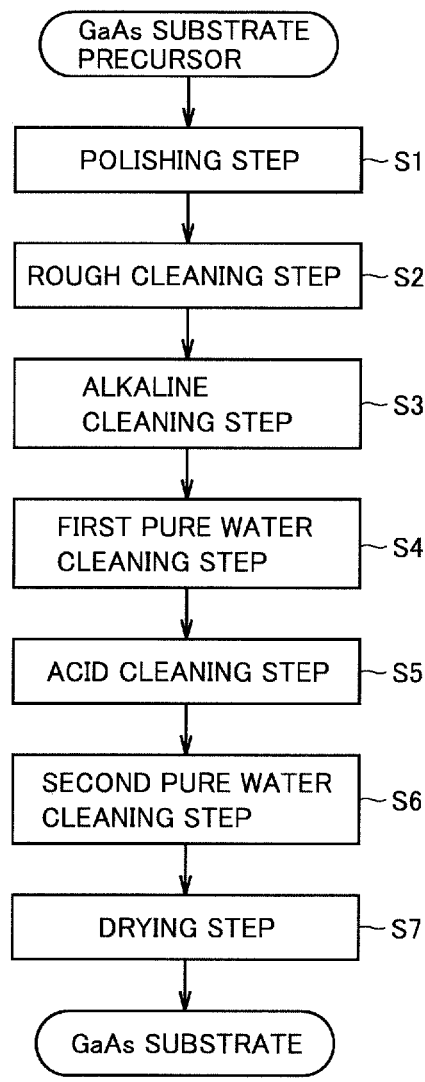
FIG. 1 is a schematic flowchart illustrating each step in a method for manufacturing a GaAs substrate in accordance with the present embodiment.

Problem to be Solved by the Present Disclosure

It has been found that, when a GaAs substrate is cleaned by applying ultrasound, detergency increases as the sound pressure of the ultrasound increases, but too high sound pressure causes deterioration in LPD (Light Point Defect) level in a surface of a film epitaxially grown on the GaAs substrate (hereinafter also referred to as an "epitaxial film"). The LPD level is a term used when the surface of the epitaxial film is irradiated with light to evaluate its smoothness (whether or not it has a difference in level), and a higher LPD value (a poorer LPD level) means that there are more level differences in the surface of the epitaxial film. This level difference originates in a stacking fault caused when the epitaxial film is grown on the GaAs substrate.

The deterioration in the LPD level correlates with degradation of device properties. Thus, the GaAs substrate is required to improve the LPD level.

In view of the above point, an object of the present disclosure is to provide a GaAs substrate which allows formation of an epitaxial film having an improved LPD level, and a method for manufacturing the same.

Advantageous Effect of the Present Disclosure

According to the above description, a GaAs substrate which allows formation of an epitaxial film having an improved LPD level, and a method for manufacturing the same can be provided.

DESCRIPTION OF EMBODIMENT

The inventors of the present invention have thoroughly conducted studies to solve the aforementioned problem, and finally reached the present disclosure. Specifically, the inventors have found that the LPD level in the surface of the epitaxial film on the GaAs substrate correlates with both the number of particles meaning foreign matter and oxides which are present in a surface of the GaAs substrate, and the number of damages meaning faults which are present inside the GaAs substrate. In particular, the inventors have found that, when the GaAs substrate is cleaned by applying ultrasound, as the sound pressure of the ultrasound to be applied increases, the number of particles can be suppressed, whereas the number of damages inside the GaAs substrate tends to increase. Based on these findings, the inventors have conceived that, when the GaAs substrate is cleaned by applying ultrasound using a sound pressure making a sum of the number of particles and the number of damages minimum, the LPD level in the surface of the epitaxial film thereon can be improved. The inventors have also found a property that the size of removable particles varies depending on the level of frequency, and finally reached the present disclosure.

First, an embodiment of the present invention will be described in list form.

[1] A GaAs substrate in accordance with one aspect of the present disclosure is a GaAs substrate having a first surface, wherein the sum of the number of particles having a longer diameter of more than or equal to 0.16 µm which are present in the first surface, per $cm^2$ of the first surface, and the number of damages having a longer diameter of more than or equal to 0.16 μm which are present in a second surface, per cm² of the second surface, is less than or equal to 2.1, the second surface being formed by etching the first surface by 0.5 μm in a depth direction. With such a configuration, the GaAs substrate allows formation of an epitaxial film having an improved LPD level, and can improve properties of this type of device.

[2] Preferably, the GaAs substrate has an $Al_xGa_{1-x}As$ film on the first surface, the $Al_xGa_{1-x}As$ film has a thickness of 0.5 to 6 μm, and the number of LPDs having a longer diameter of more than or equal to 18 μm which are present in a surface of the $Al_xGa_{1-x}As$ film, per cm² of the surface, is less than or equal to 51.2, where x is 0.5±0.1. This can achieve a superior LPD level of less than or equal to 51.2 in the surface of the $Al_xGa_{1-x}As$ film, and can further improve the properties of this type of device.

[3] Preferably, the GaAs substrate has a disk shape having a diameter of more than or equal to 2 inches and less than or equal to 8 inches. Thereby, a GaAs substrate having a superior LPD level and a large size can be provided.

[4] A method for manufacturing a GaAs substrate in accordance with one aspect of the present disclosure is a method for manufacturing a GaAs substrate having a cleaning step for obtaining the GaAs substrate from a GaAs substrate precursor, the cleaning step including a first step of cleaning the GaAs substrate precursor by applying ultrasound to the GaAs substrate precursor in an alkaline solution, and a second step of cleaning the GaAs substrate precursor by applying the ultrasound to the GaAs substrate precursor in an acid solution, the first step including an operation of continuously changing a frequency of the ultrasound at least from 900 kHz to 2 MHz, the second step including an operation of continuously changing the frequency of the ultrasound at least from 900 kHz to 2 MHz. With such a configuration, a GaAs substrate which allows formation of an epitaxial film having an improved LPD level, and improves properties of this type of device can be manufactured.

[5] Preferably, the ultrasound has a sound pressure of 60 to 80 mV. Thereby, a GaAs substrate which allows formation of an epitaxial film having a further improved LPD level can be manufactured.

DETAILS OF EMBODIMENT OF INVENTION OF PRESENT APPLICATION

An embodiment of the present invention (hereinafter also referred to as the "present embodiment") will now be described in more detail. However, the present embodiment is not limited thereto. In the following, a description will be given with reference to the drawings.

In the present specification, the expression "A to B" means a lower limit to an upper limit of a range (i.e., more than or equal to A and less than or equal to B). When no unit is indicated for A and a unit is indicated only for B, the unit of A is the same as the unit of B. Further, when a compound or the like is expressed by a chemical formula in the present specification and an atomic ratio is not limited in particular, it is assumed that all conventionally known atomic ratios are included, and the atomic ratio should not necessarily be limited to one in the stoichiometric range. For example, when "GaAs" is described, the ratio between the numbers of atoms constituting GaAs is not limited to Ga:As=1:1, and includes all conventionally known atomic ratios.

First Embodiment

<<GaAs Substrate>>

A GaAs substrate in accordance with the present embodiment has a first surface. In the GaAs substrate, the sum of the number of particles having a longer diameter of more than or equal to 0.16 μm which are present in the first surface, per cm² of the first surface, and the number of damages having a longer diameter of more than or equal to 0.16 μm which are present in a second surface, per cm² of the second surface, is less than or equal to 2.1, the second surface being formed by etching the first surface by 0.5 μm in a depth direction. Such a GaAs substrate allows growth of an epitaxial film having an improved LPD level on the substrate, and can improve properties of this type of device.

In the present specification, the "first surface" refers to a main surface of a disk-shaped wafer produced by slicing a GaAs single crystal obtained by crystal growth, beveling the crystal, and processing the crystal into the wafer. The "second surface" refers to a surface formed by etching the first surface by 0.5 μm in the depth direction.

Further, the "particles" refer to foreign matter and oxides which are present in the first surface of the GaAs substrate. In the first surface, the particles are observed as protrusions with a surface inspection apparatus described later. The "damages" are present inside the GaAs substrate. In the present disclosure, the "damages" refer to faults which are present in the second surface formed by etching the first surface by 0.5 μm in the depth direction. Examples of these faults include cracks, pits, flaws, and the like. In the second surface, the damages are observed as recesses with the surface inspection apparatus described later.

The particles and the damages can each be observed with a surface inspection apparatus (trade name: "Surf Scan 6220", manufactured by KLA-Tencor Corp.), and the numbers thereof can be determined. A specific observation method will be described below.

In the present embodiment, the number of the particles is determined as follows. First, laser scanning is performed on the entire first surface of the GaAs substrate, using the above surface inspection apparatus, to determine the total number of protrusions such as foreign matter. Then, the total number of the protrusions is divided by the area of the entire first surface to determine the number of the particles which are present in the first surface, per cm² of the first surface. In this case, it is assumed that the entire first surface of the GaAs substrate does not include a range extending inward by 3 mm from an outer edge of the substrate.

Only protrusions having a longer diameter of more than or equal to 0.16 μm are counted as the protrusions described above, because the number of particles having a longer diameter of more than or equal to 0.16 μm correlates with superiority or inferiority of an LPD level described later. The "longer diameter" of a particle refers to a distance between two points separated most in an outer circumference of the protrusion described above. Although the maximum value of the longer diameter of the protrusion should not be limited in particular, it may be set to 5 μm. This is because, since cleanliness of a clean room for manufacturing semiconductors is controlled, it is substantially impossible for foreign matter exceeding 5 μm to enter a class 100 clean room, and also to be present in the first surface of the GaAs substrate.

Further, in the present embodiment, the number of the damages is determined as follows. First, laser scanning is performed on the entire second surface formed by etching the first surface of the GaAs substrate by 0.5 μm in the depth direction, using the above surface inspection apparatus, to determine the total number of recesses such as cracks. Then, the total number of the recesses is divided by the area of the entire second surface to determine the number of the damages which are present in the second surface, per cm² of the second surface. Also in this case, it is assumed that the entire second surface of the GaAs substrate does not include the range extending inward by 3 mm from the outer edge of the substrate.

Only recesses having a longer diameter of more than or equal to 0.16 μm are counted as the recesses described above, because the number of damages having a longer diameter of more than or equal to 0.16 μm correlates with superiority or inferiority of the LPD level described later. The "longer diameter" of a damage refers to a distance between two points separated most in an outer circumference of the recess described above. Although the maximum value of the longer diameter of the recess should not be limited in particular, it may be set to 5 μm.

Here, a method for etching the first surface performed to obtain the second surface of the GaAs substrate is as follows.

First, an ammonia-hydrogen peroxide water solution (ammonia: 29 mass %, hydrogen peroxide water: 31 mass %) is prepared from 300 ml of ammonia, 100 ml of hydrogen peroxide water, and 20000 ml of water. Then, the ammonia-hydrogen peroxide water solution is heated to 30° C., and the GaAs substrate is immersed in the heated ammonia-hydrogen peroxide water solution for 25 to 45 seconds, to etch the first surface of the GaAs substrate by 0.5 μm in the depth direction. Thereby, the second surface of the GaAs substrate can be obtained. Whether the first surface of the GaAs substrate is etched by 0.5 μm is preferably evaluated at a central portion of the GaAs substrate (within a radius of 1 inch from the center of the substrate).

In the GaAs substrate in accordance with the present embodiment, the sum of the number of the particles which are present in the first surface, per cm² of the first surface, and the number of the damages which are present in the second surface, per cm² of the second surface, determined as described above, is less than or equal to 2.1. With this value, the LPD level in the surface of the epitaxial film described later grown on the GaAs substrate becomes significantly superior, resulting in good device properties.

Preferably, the sum of the number of the particles which are present in the first surface, per cm² of the first surface, and the number of the damages which are present in the second surface, per cm² of the second surface is less than or equal to 1.7. Most preferably, this value is 0 (zero).

<$Al_xGa_{1-x}As$ Film (Epitaxial Film)>

Preferably, the GaAs substrate in accordance with the present embodiment has an $Al_xGa_{1-x}As$ film on the first surface described above. That is, although a compound film to be epitaxially grown on the GaAs substrate should not be limited in particular, the compound film is preferably an $Al_xGa_{1-x}As$ film.

This is because, since $Al_xGa_{1-x}As$ is lattice-matched to the GaAs substrate in all compositions where x is from 0 to 1, a film in which the condition of the surface of the GaAs substrate is reflected most can be formed. That is, an LPD level (the number of LPDs) which highly correlates with the number of the particles which are present in the first surface and the number of the damages which are present in the second surface is exhibited in a surface of the $Al_xGa_{1-x}As$ film. Further, the GaAs substrate having an $Al_xGa_{1-x}As$ film is preferable because it is also used widely as a device.

Preferably, x in the $Al_xGa_{1-x}As$ film is 0.5±0.1. When x is within this range, the number of LPDs can be most correlated with the number of the particles which are present in the first surface and the number of the damages which are present in the second surface, in the surface of the $Al_xGa_{1-x}As$ film. More preferably, x is 0.5±0.05.

Preferably, the $Al_xGa_{1-x}As$ film has a thickness of 0.5 to 6 μm. When the thickness of the $Al_xGa_{1-x}As$ film is within this range, the GaAs substrate is applicable to a wide range of applications. More preferably, the $Al_xGa_{1-x}As$ film has a thickness of 4 to 5 μm.

If the thickness of the $Al_xGa_{1-x}As$ film is less than 0.5 μm, it tends to become difficult to correlate the number of LPDs with the number of the particles which are present in the first surface and the number of the damages which are present in the second surface, in the surface of the $Al_xGa_{1-x}As$ film. If the thickness of the $Al_xGa_{1-x}As$ film is more than 6 μm, there is a tendency that the particles and the damages have too high densities and measurement thereof becomes difficult.

Preferably, the number of LPDs having a longer diameter of more than or equal to 18 μm which are present in the surface of the $Al_xGa_{1-x}As$ film, per cm² of the surface, is less than or equal to 51.2. In this case, a GaAs substrate excellent in device properties can be provided. More preferably, the number of LPDs having a longer diameter of more than or equal to 18 μm per cm² of the surface is less than or equal to 40. Most preferably, this value is 0 (zero).

The LPDs can also be observed with the surface inspection apparatus described above (trade name: "Surf Scan 6220", manufactured by KLA-Tencor Corp.), and the number thereof can be determined. A specific observation method will be described below.

First, laser scanning is performed on the entire surface of the $Al_xGa_{1-x}As$ film on the GaAs substrate, using the above surface inspection apparatus, to determine the total number of the LPDs. Then, the total number thereof is divided by the area of the entire surface of the $Al_xGa_{1-x}As$ film to determine the number of the LPDs which are present in the surface of the $Al_xGa_{1-x}As$ film, per cm² of the surface. Also in this case, it is assumed that the entire surface of the $Al_xGa_{1-x}As$ film on the GaAs substrate does not include the range extending inward by 3 mm from the outer edge of the substrate.

Only LPDs having a longer diameter of more than or equal to 18 μm are counted as the LPDs described above, because the number of LPDs having a longer diameter of more than or equal to 18 μm correlates with superiority or inferiority of device properties. Although the maximum value of the longer diameter of the LPD should not be limited in particular, it may be set to 63 μm. This is because LPDs having a longer diameter of more than 63 μm are considered to be caused by a cause different from the causes of the particles and the damages in the GaAs substrate.

<Shape>

Preferably, the GaAs substrate has a disk shape having a diameter of more than or equal to 2 inches and less than or equal to 8 inches. The diameter of the GaAs substrate is more preferably more than or equal to 4 inches and less than or equal to 8 inches, and most preferably more than or equal to 6 inches and less than or equal to 8 inches. However, the GaAs substrate may have a disk shape having a diameter of more than or equal to 8 inches. Thereby, a large-sized GaAs substrate excellent in device properties can be provided.

The upper limit of the diameter of the GaAs substrate is 12 inches. It tends to be technically limited to manufacture a GaAs substrate having a diameter of more than 12 inches as a high-quality substrate.

Here, in the present specification, a GaAs substrate having "a diameter of 2 inches" includes a GaAs substrate having a diameter of 5 cm. That is, this "2 inches" is not "2 inches"

in a precise mathematical sense. Similarly, a GaAs substrate having "a diameter of 4 inches" includes a GaAs substrate having a diameter of 10 cm, a GaAs substrate having "a diameter of 6 inches" includes a GaAs substrate having a diameter of 15 cm, and a GaAs substrate having "a diameter of 8 inches" includes a GaAs substrate having a diameter of 20 cm. Further, a GaAs substrate having "a diameter of 12 inches" includes a GaAs substrate having a diameter of 30 cm.

<Function>

As described above, the GaAs substrate in accordance with the present embodiment allows growth of an epitaxial film having an improved LPD level on the substrate, by extremely suppressing the number of the particles in its surface and the number of the damages inside the substrate. Accordingly, the GaAs substrate can improve the properties of this type of device.

Second Embodiment

<<Method for Manufacturing GaAs Substrate>>

A method for manufacturing a GaAs substrate in accordance with the present embodiment is a method for manufacturing a GaAs substrate having a cleaning step for obtaining the GaAs substrate from a GaAs substrate precursor. The cleaning step includes a first step of cleaning the GaAs substrate precursor by applying ultrasound to the GaAs substrate precursor in an alkaline solution, and a second step of cleaning the GaAs substrate precursor by applying the ultrasound to the GaAs substrate precursor in an acid solution. Further, the first step includes an operation of continuously changing a frequency of the ultrasound at least from 900 kHz to 2 MHz, and the second step includes an operation of continuously changing the frequency of the ultrasound at least from 900 kHz to 2 MHz. Preferably, the ultrasound has a sound pressure of 60 to 80 mV.

By including the above step, the method for manufacturing the GaAs substrate can manufacture a GaAs substrate which allows growth of an epitaxial film having an improved LPD level on the substrate, and improves properties of this type of device. In particular, in the above cleaning step, the ultrasound is preferably applied to the entire surface of the GaAs substrate precursor.

Through earnest studies on methods for manufacturing a GaAs substrate having improved device properties, the inventors of the present invention have found that there is an inverse correlation between the magnitude of the sound pressure of the ultrasound and the number of particles adhering to and remaining on the surface of the GaAs substrate precursor. The inventors have also found that there is a positive correlation between the magnitude of the sound pressure of the ultrasound and damages caused in the GaAs substrate precursor. In addition, the inventors have also found that there is a positive correlation between the frequency of the ultrasound (length of a wavelength) and the size of removable foreign matter particles. As the frequency of the ultrasound decreases, particles having a larger size can be removed, and as the frequency of the ultrasound increases, particles having a smaller size can be removed.

Based on these findings, the inventors have conceived of removing particles of all sizes by applying the ultrasound to the GaAs substrate precursor, with its frequency being continuously changed from a low frequency side to a high frequency side. In this case, the inventors have conceived of applying the ultrasound with a sound pressure having a magnitude at which particles can be removed most and damages to the GaAs substrate precursor are suppressed most. Specifically, in the method for manufacturing the GaAs substrate in accordance with the present embodiment, the ultrasound is applied to the GaAs substrate precursor in each of an alkaline cleaning step S3 and an acid cleaning step S5 described later. On this occasion, the frequency of the ultrasound is continuously changed at least from 900 kHz to 2 MHz. Further, the ultrasound to be applied to the GaAs substrate precursor preferably has a sound pressure of 60 to 80 mV.

Each step included in the method for manufacturing the GaAs substrate in accordance with the present embodiment will now be specifically described based on FIG. 1.

First, the method for manufacturing the GaAs substrate preferably includes a polishing step S1. Polishing step S1 is a step of polishing a surface of a GaAs wafer sliced from a GaAs single crystal. The surface of the GaAs wafer is mirror-finished by polishing step S1. As a polishing method in polishing step S1, any conventionally known method can be used, and various polishing methods such as a variety of mechanical polishing and chemical mechanical polishing can be used.

The method for manufacturing the GaAs substrate preferably includes a rough cleaning step S2. Rough cleaning step S2 is a step of cleaning foreign matter within a polishing agent adhering to the surface of the GaAs wafer which is mirror-finished in polishing step S1. As a cleaning method in rough cleaning step S2, any conventionally known method can also be used. By undergoing rough cleaning step S2, a GaAs substrate precursor can be obtained.

The method for manufacturing the GaAs substrate includes alkaline cleaning step S3. Alkaline cleaning step S3 is a step of performing alkaline cleaning on the above GaAs substrate precursor using an alkaline solution, and applying ultrasound to the GaAs substrate precursor in the alkaline solution. Although the alkaline solution used in alkaline cleaning step S3 should not be limited in particular, the alkaline solution is preferably an aqueous solution containing an organic alkaline compound which does not contain a metallic element that affects electrical properties, for example, a quaternary ammonium hydroxide such as choline or tetramethylammonium hydroxide (TMAH), a quaternary pyridinium hydroxide, or the like. The alkaline solution preferably has a concentration of 0.1 to 10 mass %.

Further, in alkaline cleaning step S3, the frequency of the ultrasound to be applied to the GaAs substrate precursor is continuously changed to increase from the low frequency side to the high frequency side. On this occasion, the ultrasound is required to cover frequencies at least from 900 kHz to 2 MHz. Preferably, the ultrasound to be applied to the GaAs substrate precursor covers frequencies from 800 kHz to 3 MHz. Although ultrasound having a low frequency less than 800 kHz and a high frequency more than 3 MHz may be applied to the GaAs substrate precursor, the ultrasound having these frequencies tends to have an insufficient capability of removing particles. Further, also when the range of the ultrasound to be applied to the GaAs substrate precursor starts from a frequency more than 900 kHz or ends at a frequency less than 2 MHz, removal of particles tends to be insufficient.

The ultrasound to be applied to the GaAs substrate precursor preferably has a sound pressure of 60 to 80 mV. The sound pressure is more preferably 65 to 75 mV. If the ultrasound to be applied to the GaAs substrate precursor has a sound pressure of less than 60 mV, removal of particles tends to be insufficient. If the ultrasound to be applied to the GaAs substrate precursor has a sound pressure of more than 80 mV, the GaAs substrate precursor tends to be damaged.

The method for manufacturing the GaAs substrate preferably includes a first pure water cleaning step S4 after alkaline cleaning step S3. Although a cleaning method in first pure water cleaning step S4 should not be limited in particular, it is preferable to clean a surface of the GaAs substrate precursor subjected to alkaline cleaning, with pure water having a dissolved oxygen concentration (DO) of less than or equal to 100 ppb, for less than or equal to 5 minutes. This can suppress oxidation of the surface of the GaAs substrate precursor. More preferably, the pure water has a dissolved oxygen concentration of less than or equal to 50 ppb. Preferably, the pure water has a total organic carbon (TOC) of less than or equal to 40 ppb.

The method for manufacturing the GaAs substrate includes acid cleaning step S5. Acid cleaning step S5 is a step of performing acid cleaning on the above GaAs substrate precursor using an acid solution, and applying the ultrasound to the GaAs substrate precursor in the acid solution. Acid cleaning step S5 is preferably performed on the GaAs substrate precursor which has undergone first pure water cleaning step S4. By undergoing acid cleaning step S5, a GaAs substrate can be obtained.

Although the acid solution used in acid cleaning step S5 should not be limited in particular, the acid solution is preferably an aqueous solution which has a high detergency, which does not contain an element that affects electrical properties (for example, a metallic element, sulfur, or the like), and which is less likely to cause serious secondary contamination and equipment degradation when droplets thereof are dispersed within equipment, as an acid component also evaporates together with moisture. From this viewpoint, the acid solution is preferably an aqueous solution containing at least one selected from the group consisting of hydrofluoric acid (HF), hydrochloric acid (HCl), nitric acid ($HNO_3$), and nitrous acid ($HNO_2$), or an aqueous solution containing an organic acid, such as acetic acid, citric acid, or malic acid. The acid solution may be a combination of two or more of the acids described above, for example, a combination of hydrochloric acid and nitric acid. The acid solution preferably has a concentration of 0.3 ppm to 0.5 mass %. The acid solution more preferably contains 0.3 ppm to 0.3 mass % of hydrogen peroxide ($H_2O_2$), in view of high detergency.

By containing an acid having an appropriate concentration, the acid solution can optimize the ratio between Ga atoms and As atoms in the surface of the GaAs substrate precursor, and can suppress generation of gallium oxides. In both cases where the acid solution has an acid concentration of less than 0.3 ppm and where the acid solution has an acid concentration of more than 0.5 mass %, variations in chemical composition within a wafer surface and between wafers tend to become greater.

Further, in acid cleaning step S5, the ultrasound is applied to the GaAs substrate precursor, as in alkaline cleaning step S3. On this occasion, the ultrasound having a frequency at least from 900 kHz to 2 MHz is applied, with being continuously changed from the low frequency side to the high frequency side. Preferably, the ultrasound to be applied to the GaAs substrate precursor covers frequencies from 800 kHz to 3 MHz. In addition, the ultrasound to be applied to the GaAs substrate precursor preferably has a sound pressure of 60 to 80 mV. The sound pressure is more preferably 65 to 75 mV. Influences caused when the sound pressure and the frequency of the ultrasound deviate from the parameters described above are the same as those described for alkaline cleaning step S3.

The method for manufacturing the GaAs substrate preferably includes a second pure water cleaning step S6 after acid cleaning step S5. A cleaning method in second pure water cleaning step S6 can be performed in the same way as first pure water cleaning step S4. The type of pure water to be used may also be the same as that used in first pure water cleaning step S4.

The method for manufacturing the GaAs substrate preferably includes a drying step S7 at the end of the process. The GaAs substrate is dried in drying step S7. As a drying method in drying step S7, any conventionally known method can be used. In this manner, a GaAs substrate which allows formation of an epitaxial film having an improved LPD level can be manufactured.

Here, in the method for manufacturing the GaAs substrate in accordance with the present embodiment, in acid cleaning step S5, acid cleaning is preferably performed by supplying the acid solution to the surface of the GaAs substrate precursor while holding the GaAs substrate precursor such that its surface is horizontal and rotating the GaAs substrate precursor at 100 to 800 rpm. This can achieve efficient cleaning while suppressing oxidation of the surface. Also in second pure water cleaning step S6 after acid cleaning step S5, pure water cleaning is preferably performed by supplying the pure water to the surface of the GaAs substrate precursor while holding the GaAs substrate precursor such that its surface is horizontal and rotating the GaAs substrate precursor at 100 to 800 rpm. Further, in drying step S7, it is preferable to disperse the acid solution and the pure water remaining on the surface by rotating the GaAs substrate at more than or equal to 2000 rpm.

EXAMPLE

The present invention will now be described in more detail, with reference to an example. However, the present invention is not limited thereto.

<<Sample 1>>
<Manufacturing of GaAs Substrates>
(1) Fabrication of GaAs Wafers (Wafer Fabrication Step)

A GaAs single crystal grown by the vertical Bridgman (VB) method was sliced with a wire saw, and an edge portion thereof was ground to trim the outer shape, to fabricate a GaAs wafer. Two GaAs wafers were fabricated. Further, to remove saw marks caused by the wire saw, a main surface of each GaAs wafer was ground with a surface grinding machine, and then an outer circumferential beveled portion was polished with a rubber grindstone.

(2) Polishing and Rough Cleaning of Surface of Each GaAs Wafer (Polishing Step and Rough Cleaning Step)

Within a clean room (class 100), the surface of each GaAs wafer was polished with a hard polishing cloth containing a mixture of a chlorine-based polishing agent and silica powder. Then, the surface of each GaAs wafer was mirror-finished by being polished with INSEC NIB polishing agent (manufactured by FUJIMI INCORPORATED). Further, each GaAs wafer having the mirror-finished surface was rough-cleaned by IPA ultrasonic cleaning to obtain a GaAs substrate precursor.

(3) Alkaline Cleaning of Surface of GaAs Substrate Precursor (Alkaline Cleaning Step)

The above GaAs substrate precursor was immersed in 0.1 to 10 mass % of a choline aqueous solution. Simultaneously, to the entire surface of the GaAs substrate precursor in this aqueous solution, ultrasound was given at a frequency of 500 kHz, and was applied for 5 minutes under a condition of a sound pressure of 10 mV. Thereby, alkaline cleaning was performed on the surface of the GaAs substrate precursor.

(4) First Pure Water Cleaning of Surface of GaAs Substrate Precursor (First Pure Water Cleaning Step)

Next, the surface of the GaAs substrate precursor subjected to alkaline cleaning was cleaned with pure water having a dissolved oxygen concentration (DO) of 1 ppb, for 5 minutes. The pure water had a total organic carbon (TOC) of 0.5 ppb.

(5) Acid Cleaning of Surface of GaAs Substrate Precursor (Acid Cleaning Step)

The GaAs substrate precursor cleaned with the pure water described above was placed within a cleaning apparatus having a mechanism capable of rotatably holding the GaAs substrate precursor such that its main surface was horizontal. On this occasion, the GaAs substrate precursor was held by a centrifugal chuck within the cleaning apparatus. This centrifugal chuck was made of a low-dust-generation resin such as polyamide resin or polyether ether ketone resin.

While rotating the GaAs substrate precursor at 300 to 600 rpm, an aqueous solution containing 0.1 to 0.6 mass % of HF and 0.05 to 0.3 mass % of $H_2O_2$ was supplied to its surface, as an acid solution. Simultaneously, to the entire surface of the GaAs substrate precursor, the ultrasound was given at a frequency of 500 kHz, and was applied for 5 minutes under a condition of a sound pressure of 10 mV. Thereby, acid cleaning was performed.

(6) Second Pure Water Cleaning of Surface of GaAs Substrate Precursor (Second Pure Water Cleaning Step)

Next, while rotating the GaAs substrate precursor subjected to acid cleaning at 300 to 600 rpm, pure water having a dissolved oxygen concentration of 1 ppb and a total organic carbon of 0.5 ppb was supplied to the surface of the GaAs substrate precursor for 5 minutes, to perform pure water cleaning. Thereby, two GaAs substrates of sample 1 were obtained.

(7) Drying of GaAs Substrates (Drying Step)

Finally, the surface (first surface) of each GaAs substrate was dried by rotating the GaAs substrate at 2500 rpm for 15 to 30 seconds.

<Various Analyses for GaAs Substrates>

(1) Analysis of First Surface of GaAs Substrate

The first surface of one of the two GaAs substrates of sample 1 was observed with the above surface inspection apparatus (trade name: "Surf Scan 6220", manufactured by KLA-Tencor Corp.), to determine the number of particles having a longer diameter of more than or equal to 0.16 μm which were present in the first surface, per cm² of the first surface, in a manner as described above.

(2) Analysis of Second Surface of GaAs Substrate

The first surface of the other of the two GaAs substrates of sample 1 was etched by an etching method using the ammonia-hydrogen peroxide water solution described above, to obtain a second surface of the GaAs substrate. The second surface was also observed with the above surface inspection apparatus (trade name: "Surf Scan 6220", manufactured by KLA-Tencor Corp.), to determine the number of damages having a longer diameter of more than or equal to 0.16 μm which were present in the second surface, per cm² of the second surface, in a manner as described above.

(3) Growth of Epitaxial Film on GaAs Substrate

On the first surface of the one of the GaAs substrates of sample 1 (the one not etched), an $Al_xGa_{1-x}As$ (x=0.5) film having a thickness of 5 μm was grown as an epitaxial film by a conventional organic metal vapor phase epitaxy method (OMVPE), to obtain an epitaxial film-provided GaAs substrate.

(4) Analysis of Surface of Epitaxial Film-Provided GaAs Substrate

A surface of the $Al_xGa_{1-x}As$ film of the epitaxial film-provided GaAs substrate was observed with the above surface inspection apparatus (trade name: "Surf Scan 6220", manufactured by KLA-Tencor Corp.), to determine the number of LPDs having a longer diameter of more than or equal to 18 μm which were present in the surface of the $Al_xGa_{1-x}As$ film, per cm² of the surface, in a manner as described above.

<<Sample 2>>

<Manufacturing of GaAs Substrates>

GaAs substrates of sample 2 were obtained by the same manufacturing method as that for the GaAs substrates of sample 1, except that the frequency of the ultrasound to be applied in the alkaline cleaning step and the acid cleaning step was set to 950 kHz, and the sound pressure thereof was changed to 56 mV.

<Various Analyses for GaAs Substrates>

Analysis of the first surface, analysis of the second surface, growth of the epitaxial film ($Al_xGa_{1-x}As$ film), and analysis of the surface of the $Al_xGa_{1-x}As$ film in the GaAs substrates of sample 2 were performed by the same methods as those used for the GaAs substrates of sample 1.

<<Sample 3>>

<Manufacturing of GaAs Substrates>

GaAs substrates of sample 3 were obtained by the same manufacturing method as that for the GaAs substrates of sample 1, except that the frequency of the ultrasound to be applied in the alkaline cleaning step and the acid cleaning step was continuously changed from 900 kHz to 2 MHz, from the lower frequency side to the high frequency side, and the sound pressure thereof was changed to 61 mV.

<Various Analyses for GaAs Substrates>

Analysis of the first surface, analysis of the second surface, growth of the epitaxial film ($Al_xGa_{1-x}As$ film), and analysis of the surface of the $Al_xGa_{1-x}As$ film in the GaAs substrates of sample 3 were performed by the same methods as those used for the GaAs substrates of sample 1.

<<Sample 4>>

<Manufacturing of GaAs Substrates>

GaAs substrates of sample 4 were obtained by the same manufacturing method as that for the GaAs substrates of sample 1, except that the frequency of the ultrasound to be applied in the alkaline cleaning step and the acid cleaning step was continuously changed from 900 kHz to 2 MHz, from the lower frequency side to the high frequency side, and the sound pressure thereof was changed to 68 mV.

<Various Analyses for GaAs Substrates>

Analysis of the first surface, analysis of the second surface, growth of the epitaxial film ($Al_xGa_{1-x}As$ film), and analysis of the surface of the $Al_xGa_{1-x}As$ film in the GaAs substrates of sample 4 were performed by the same methods as those used for the GaAs substrates of sample 1.

<<Sample 5>>

<Manufacturing of GaAs Substrates>

GaAs substrates of sample 5 were obtained by the same manufacturing method as that for the GaAs substrates of sample 1, except that the frequency of the ultrasound to be applied in the alkaline cleaning step and the acid cleaning step was set to 950 kHz, and the sound pressure thereof was changed to 86 mV.

<Various Analyses for GaAs Substrates>
Analysis of the first surface, analysis of the second surface, growth of the epitaxial film ($Al_xGa_{1-x}As$ film), and analysis of the surface of the $Al_xGa_{1-x}As$ film in the GaAs substrates of sample 5 were performed by the same methods as those used for the GaAs substrates of sample 1.

<<Sample 6>>
<Manufacturing of GaAs Substrates>
GaAs substrates of sample 6 were obtained by the same manufacturing method as that for the GaAs substrates of sample 1, except that the frequency of the ultrasound to be applied in the alkaline cleaning step and the acid cleaning step was set to 500 kHz, and the sound pressure thereof was changed to 122 mV.

<Various Analyses for GaAs Substrates>
Analysis of the first surface, analysis of the second surface, growth of the epitaxial film ($Al_xGa_{1-x}As$ film), and analysis of the surface of the $Al_xGa_{1-x}As$ film in the GaAs substrates of sample 6 were performed by the same methods as those used for the GaAs substrates of sample 1.

Table 1 shows the number of particles, the number of damages, the sum thereof, and the number of LPDs in samples 1 to 6 determined from the analyses described above. Here, in the present example, sample 3 represents Example 1, and sample 4 represents Example 2. Samples 1, 2, 5, and 6 represent comparative examples.

Figure 2:
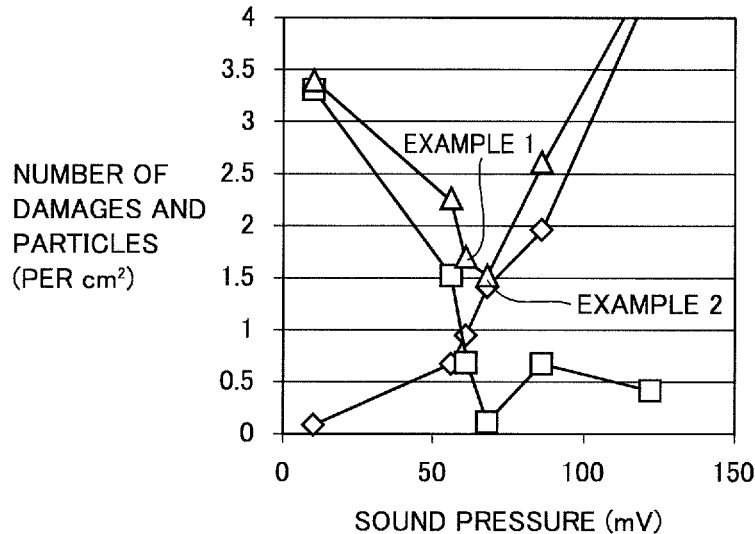
FIG. 2 is a graph showing the relation between the magnitude of sound pressure applied in a cleaning step and the number of particles and damages, regarding GaAs substrates in accordance with examples and comparative examples.
Figure 3:
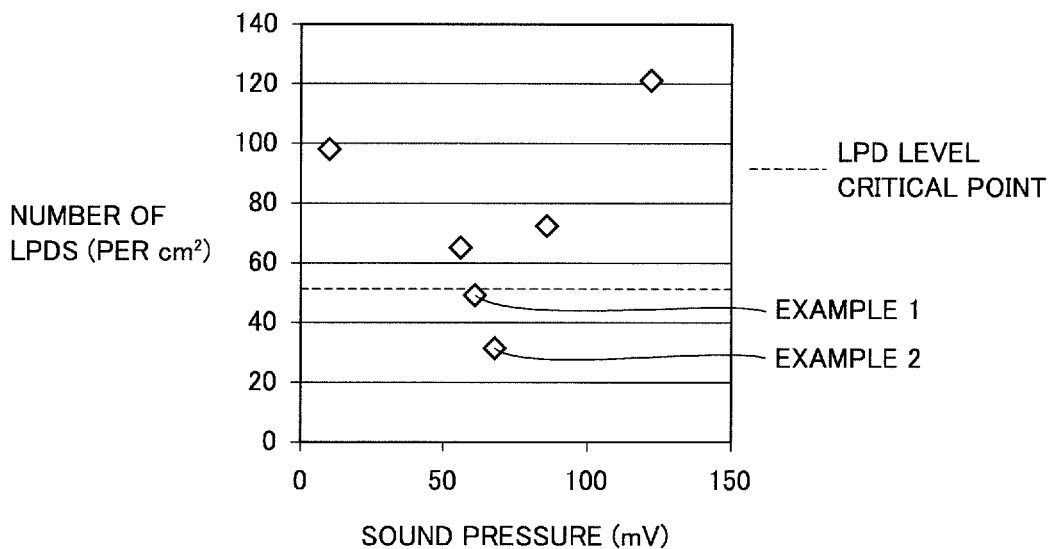
FIG. 3 is a graph showing the relation between the magnitude of sound pressure applied in the cleaning step and the number of LPDs in a surface of an epitaxial film, regarding the GaAs substrates in accordance with the examples and the comparative examples.

In addition, based on the results shown in Table 1, regarding the GaAs substrates of the examples and the comparative examples, a graph showing the relation between the magnitude of sound pressure applied in the cleaning steps and the number of particles and damages is shown in FIG. 2, and a graph showing the relation between the magnitude of sound pressure applied in the cleaning steps and the number of LPDs in the surface of the epitaxial film is shown in FIG. 3.

TABLE 1

|  | Power (W) | Frequency (Hz) | Sound Pressure (mV) | Substrate | | | Epitaxial Film $Al_xGa_{1-x}As$ |
| --- | --- | --- | --- | --- | --- | --- | --- |
|  |  |  |  | Number of Damages (a) (per cm$^2$) ≥0.16 μm | Number of Particles (b) (per cm$^2$) ≥0.16 μm | (a) + (b) (per cm$^2$) ≥0.16 μm | Number of LPDs (per cm$^2$) ≥18 μm |
| Sample 1 | 40 | 500 | 10 | 0.09 | 3.31 | 3.39 | 98.1 |
| Sample 2 | 100 | 950 | 56 | 0.68 | 1.57 | 2.25 | 65.2 |
| Sample 3 | 170 | 900 to 2000 | 61 | 0.95 | 0.68 | 1.63 | 49.2 |
| Sample 4 | 270 | 900 to 2000 | 68 | 1.41 | 0.11 | 1.52 | 31.5 |
| Sample 5 | 370 | 950 | 86 | 1.96 | 0.66 | 2.62 | 72.4 |
| Sample 6 | 600 | 500 | 122 | 4.28 | 0.48 | 4.76 | 121.2 |

<Consideration>
As shown in Table 1, FIG. 2, and FIG. 3, in the GaAs substrates of Example 1 (sample 3) and Example 2 (sample 4), the sum of the number of particles having a longer diameter of more than or equal to 0.16 μm which were present in the first surface and the number of damages having a longer diameter of more than or equal to 0.16 μm which were present in the second surface was less than or equal to 2.1 (FIG. 2). On this occasion, the number of LPDs having a longer diameter of more than or equal to 18 μm which were present in the surface of the $Al_xGa_{1-x}As$ film was less than or equal to 51.2 (FIG. 3). Accordingly, the GaAs substrates of Example 1 and Example 2 were considered to be GaAs substrates excellent in device properties.

In contrast, in the GaAs substrates of the comparative examples (samples 1, 2, 5, and 6), the sum of the number of particles having a longer diameter of more than or equal to 0.16 μm which were present in the first surface and the number of damages having a longer diameter of more than or equal to 0.16 μm which were present in the second surface was more than 2.1. On this occasion, the number of LPDs having a longer diameter of more than or equal to 18 μm which were present in the surface of the $Al_xGa_{1-x}As$ film was also more than 51.2. Thus, rapid deterioration of device properties was suggested in the GaAs substrates of the comparative examples.

Although the embodiments and the example of the present invention have been described above, it is also originally intended to combine the configurations of the embodiments and the example described above as appropriate.

It should be understood that the embodiments disclosed herein are illustrative and non-restrictive in every respect. The scope of the present invention is defined by the scope of the claims, rather than the embodiments described above, and is intended to include any modifications within the scope and meaning equivalent to the scope of the claims.

The invention claimed is:

1. A GaAs substrate having a first surface, wherein
a sum of a number of particles having a longer diameter of more than or equal to 0.16 μm which are present in the first surface, per cm$^2$ of the first surface, and a number of damages having a longer diameter of more than or equal to 0.16 μm which are present in a second surface, per cm$^2$ of the second surface, is less than or equal to 1.63, the second surface being formed by etching the first surface by 0.5 μm in a depth direction, wherein
the longer diameter of the particle refers to a distance between two points separated most in an outer circumference of the particle, and
the damages refer to faults.

2. The GaAs substrate according to claim 1, wherein
the GaAs substrate has an $Al_xGa_{1-x}As$ film on the first surface,
the $Al_xGa_{1-x}As$ film has a thickness of 0.5 to 6 μm, and
a number of LPDs having a longer diameter of more than or equal to 18 μm which are present in a surface of the $Al_xGa_{1-x}As$ film, per cm$^2$ of the surface, is less than or equal to 49.2,
where x is 0.5±0.1, and wherein
the LPDs refer to light point defects.

3. The GaAs substrate according to claim 1, wherein the GaAs substrate has a disk shape having a diameter of more than or equal to 2 inches and less than or equal to 8 inches.

4. A method for manufacturing a GaAs substrate having a cleaning step for obtaining the GaAs substrate from a GaAs substrate precursor, the cleaning step including a first step of cleaning the GaAs substrate precursor by applying ultrasound to the GaAs substrate precursor in an alkaline solution, and a second step of cleaning the GaAs substrate precursor by applying the ultrasound to the GaAs substrate precursor in an acid solution, the first step including an operation of continuously changing a frequency of the ultrasound at least from 900 kHz to 2 MHz, the second step including an operation of continuously changing the frequency of the ultrasound at least from 900 kHz to 2 MHz.

5. The method for manufacturing the GaAs substrate according to claim 4, wherein the ultrasound has a sound pressure of 60 to 80 mV.

* * * * *